United States Patent
Rybnicek

(10) Patent No.: US 7,233,048 B2
(45) Date of Patent: Jun. 19, 2007

(54) MEMS DEVICE TRENCH PLATING PROCESS AND APPARATUS FOR THROUGH HOLE VIAS

(75) Inventor: Kimon Rybnicek, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 90 days.

(21) Appl. No.: 11/211,624

(22) Filed: Aug. 26, 2005

(65) Prior Publication Data

US 2007/0045820 A1    Mar. 1, 2007

(51) Int. Cl.
*H01L 27/00*    (2006.01)
*H01L 21/00*    (2006.01)

(52) U.S. Cl. .............................. 257/414; 257/E27.001; 438/48

(58) Field of Classification Search ................ 257/774; 438/667
See application file for complete search history.

(56) References Cited

U.S. PATENT DOCUMENTS

| | | | |
|---|---|---|---|
| 6,017,820 A * | 1/2000 | Ting et al. | 438/689 |
| 6,486,425 B2 | 11/2002 | Seki | |
| 6,580,138 B1 | 6/2003 | Kubena et al. | |
| 6,746,891 B2 | 6/2004 | Cunningham et al. | |
| 6,818,464 B2 | 11/2004 | Heschel | |
| 6,876,482 B2 | 4/2005 | DeReus | |
| 6,897,148 B2 * | 5/2005 | Halahan et al. | 438/678 |
| 6,917,086 B2 | 7/2005 | Cunningham et al. | |

OTHER PUBLICATIONS

Y. Nishi, Editor, "Handbook of Semiconductor Manufacturing Technology", 2000, Marcel Dekker, pp. 402-413.*

"RF MEMS and MEMS packaging," M. Hara, et al., Second International Symposium on Acoustic Wave Devices for Future Mobile Communications Systems, Thursday, Mar. 4, 2004, pp. 115-122.

"Copper Metallization of Semiconductor Interconnects—Issues and Prospects", Uziel Landau, Invited Talk, CMP, Symposium, Abstract # 505, Electrochemical Society Meeting, Phoenix, AZ, Oct. 22-27, 2000.

* cited by examiner

*Primary Examiner*—Evan Pert
(74) *Attorney, Agent, or Firm*—Jaquelin K. Spong

(57) ABSTRACT

A method for forming through hole vias in a substrate uses a partially exposed seed layer to plate the bottom of a blind trench formed in the front side of a substrate. Thereafter, the plating proceeds substantially uniformly from the bottom of the blind hole to the top. To form the through hole, the rear face of the substrate is ground or etched away to remove material up to and including the dead-end wall of the blind hole.

19 Claims, 10 Drawing Sheets

MEMS DEVICE TRENCH PLATING PROCESS AND APPARATUS FOR THROUGH HOLE VIAS

CROSS REFERENCE TO RELATED APPLICATIONS

This U.S. patent application is related to U.S. patent application Ser. No. 11/211,625, U.S. patent application Ser. No. 11/211,622 and U.S. patent application Ser. No. 11/211,623 filed on an even date herewith, each of which is incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to a process for plating through hole vias having high aspect ratios.

Electrical vias allow electrical access to electronic devices or microelectromechanical systems (MEMS) within a package or in a circuit. In order to continually reduce the cost of such packages and circuits, the packing density of devices within the packages and circuits has been continually increased. In order to support the increase in packing density, the pitch between electrical vias for the devices has also continued to shrink. As a consequence, there is a desire to form vias of increasingly large aspect ratio, that is, the vias are tending to become increasingly long and narrow.

Long, narrow vias are often created by plating a conductive material into a hole formed in a substrate. FIG. 1 illustrates a typical prior art process for forming an electrical via by electroplating. A hole 14 is created in a substrate 12 by a directional material removal process such as reactive ion etching (RIE). A seed layer 16 is then deposited conformally over the etched surface, to provide a conductive layer to attract the plating material from the plating bath Another known method for making vias is to use an anisotropic etch to form the holes with sloping sidewalls, and to deposit the conductive material on the sloped walls of the holes. However, this method often results in conductive material having non-uniform thickness, and the heat conduction in the thin deposited layer is relatively poor. The aspect ratio must also remain near 1:2 (width=2× depth), further limiting the density of the vias.

SUMMARY

However, when using the approach illustrated schematically in FIG. 1, the plated material has a tendency to concentrate at the corners 18 of the blind hole 14. This tendency results from the proportionately larger density of field lines emanating from the corners, and from geometric considerations, that is, the aspect ratio of the via Since the via is deeper than it is wide, the build up of material in the cylinder of the via will close off the cylinder before the plated material reaches the top of the substrate and completely fills the hole. Since the aperture to the via has become closed, the plating bath no longer circulates and the confined bath within the hole is exhausted of its plating species. Plating into the hole will then cease, and a void is formed beneath the point of closure of the via aperture. Since these problems worsen as the via becomes longer and narrower, the approach illustrated in FIG. 1 becomes increasingly difficult for long, narrow vias. Specialized bath chemistries have been developed that reduce the negative effects cited above, but they can be expensive and are difficult to control.

Systems and methods are described here which address the above-mentioned problem, and are particularly applicable to the formation of long, narrow vias by plating. The systems and methods expose only a portion of the seed layer, to effect a "partially" exposed seed layer, to the plating bath, that portion being located at the bottom of the blind hole. Since the seed layer is only exposed in the bottom of the blind hole, the plating material may necessarily deposit first at the bottom of the blind hole. As the plating proceeds, the hole may be filled uniformly from the bottom to the top, and no voids are formed. The vias formed using these methods are solid metal, so that the heat conduction through the vias may be excellent.

In one exemplary embodiment, the partially exposed seed layer may be formed by depositing an inhibition layer over the seed layer. The inhibition layer may be formed by sputter-depositing a non-conductive material over the seed layer, with the wafer disposed at an angle with respect to the sputter target. The angle of deposition may cause the rim of the blind hole to shadow the lower portion of the opposing wall, so that the inhibition layer may only be deposited above the range of the shadow. The inhibition layer may inhibit the plating of material from the plating bath wherever it is located. The shadowing effect caused by the rim of the blind hole may cause the inhibition layer to cover only the upper portion of the seed layer, leaving only the bottom portion uncoated and therefore effective as a terminal in the plating bath.

Since the inhibition layer may cover the seed layer everywhere but at the bottom of the blind trench, the plating of the trench via material necessarily proceeds from the bottom up.

The wafer may then be planarized, which removes the seed layer from the top of the wafer, so that the blind hole vias are electrically isolated from one another.

To make the through hole vias, the backside of the wafer may be ground before or after bonding to remove material up to the dead-end wall of the blind hole, leaving the conductive vias extending through the substrate. A silicon-on-insulator (SOI) wafer may also be used, wherein the thicker handle wafer may be selectivity wet or dry etched from the thinner device layer to reveal the vias without the need for grinding.

The systems and methods may therefore include etching at least one trench with a dead-end wall in a front side of a substrate, forming a partially exposed seed layer in the trench, and depositing a conductive material within the trench. The backside of the wafer may also be processed to remove material up to the dead-end wall of the trench, to form a through hole via.

Systems and methods will be described particularly with attention paid to the formation of the partially exposed seed layer. The remaining process steps needed to form the completed through hole via will also be described.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

Figure 1:
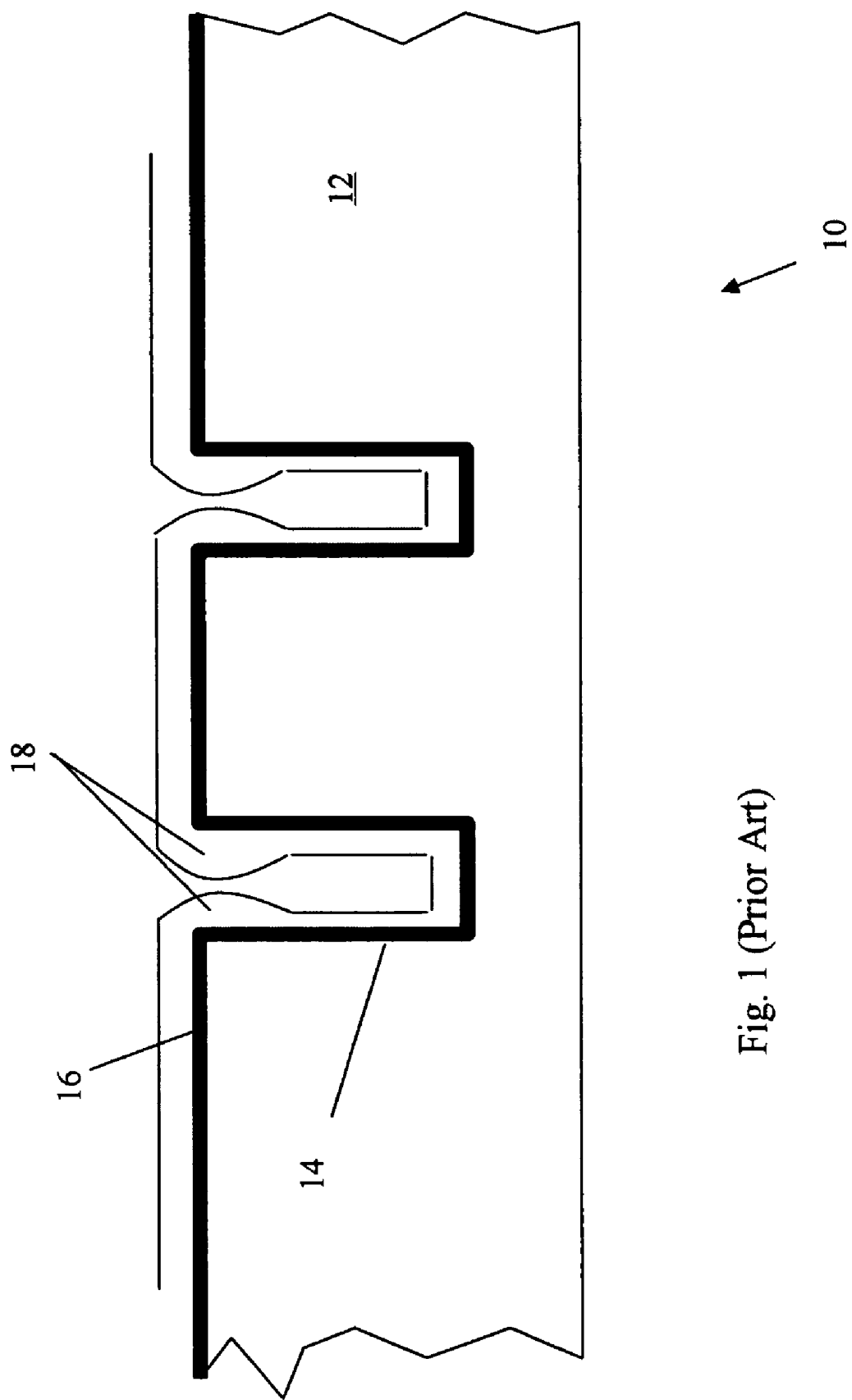
FIG. 1 is a cross sectional view showing a prior art approach to the formation of a plated via.

The systems and methods described herein may be particularly applicable to microelectromechanical devices, wherein the vias may be required to carry a relatively large amount of current. MEMS devices are often fabricated on a composite silicon-on-insulator wafer, consisting of a relatively thick (about 675 µm) "handle" layer of silicon overcoated with a thin (about 1 µM) layer of silicon dioxide, and covered with a silicon "device" layer. The MEMS device is made by forming moveable features in the device layer by, for example, deep reactive ion etching (DRIE) with the silicon dioxide layer forming a convenient etch stop. The movable feature is then freed by, for example, wet etching the silicon dioxide layer from beneath the moveable feature. The moveable features may then be hermetically encapsulated in a cap or lid wafer, which is bonded or otherwise adhered to the top of the silicon device layer, to protect the moveable features from damage from handling and/or to seal a particular gas in the device as a preferred environment for operation of the MEMS device.

Through-hole vias are particularly convenient for MEMS devices, because they may allow electrical access to the encapsulated devices. Without such through holes, electrical access to the MEMS device may have to be gained by electrical leads routed under the capping wafer which is then hermetically sealed. It may be problematic, however, to achieve a hermetic seal over terrain that includes the electrical leads unless more complex and expensive processing steps are employed. This approach also makes radio-frequency applications of the device limited, as electromagnetic coupling will occur from the metallic bondline residing over the normally oriented leads. Alternatively, the electrical access may be achieved with through-wafer vias formed through the handle wafer, using the systems and methods described here.

The through hole vias may be constructed by first forming a blind trench in the substrate, and then forming a partially exposed seed layer in the blind trench. It should be understood that although the word "trench" is used, the term should be construed as including any shape of opening, including a circular hole. In addition, the term "partially exposed seed layer" should be understood to mean a seed layer which is only exposed or effective over a particular portion, such as its lower extremity, but nonetheless functions as a terminal for the plating process. A "through hole via" should be construed to mean an electrical conduit which extends completely through a material, for example, through a wafer or substrate.

The partially exposed seed layer may then be plated with a conductive material, for example, copper. The substrate may then be planarized using, for example, chemical mechanical polishing. The handle layer may then be ground to remove the dead-end wall of the blind trench, to create the through hole via. Alternatively, the device and insulating layers of a silicon-on-insulator composite wafer may be removed, to reveal the through-hole vias.

Figure 2:
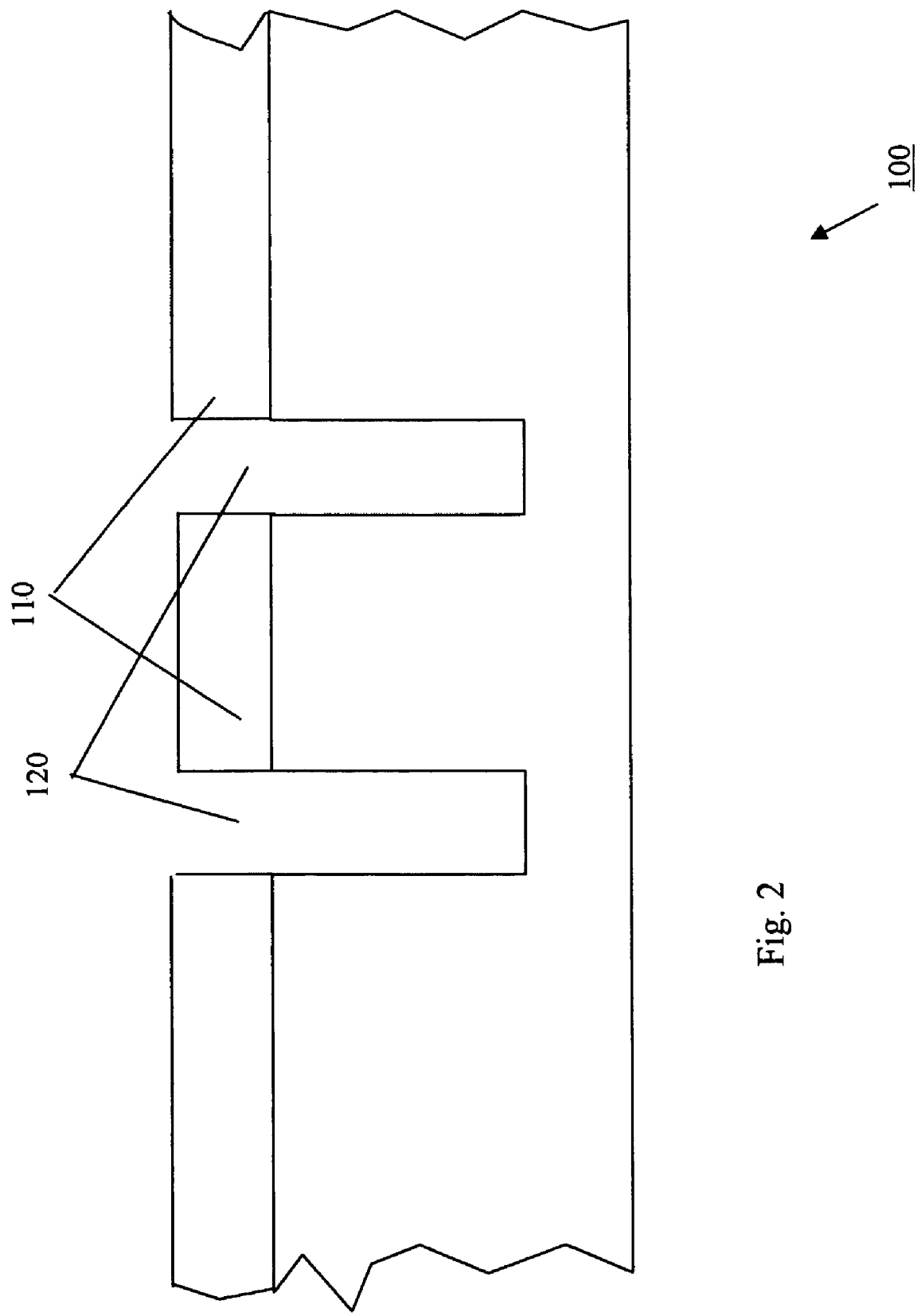
FIG. 2 is a cross sectional view of an exemplary substrate after a first step of fabrication.

FIG. 2 is a cross sectional view of an exemplary substrate 100 after a first step in the fabrication of the plated through hole via. The substrate 100 may be, for example, silicon, float zone silicon or any of a number of other common substrate materials, such as glass. The substrate 100 is first coated with photoresist 110 and exposed in regions where the blind trenches, or blind holes 120 are to be formed. The photoresist 110 is exposed and developed, such that areas which have been exposed are dissolved and removed, if using a positive photoresist. If using a negative photoresist, the areas which have not been exposed may be dissolved and removed. The means for forming the blind trenches or holes 120 may be, for example, deep reactive ion etching (DRIE), which is performed on the region of the substrate over which the photoresist has been dissolved and removed. The remaining photoresist 110 is then removed from the substrate 100. At this point, a thermal oxidation process or other electrically insulating deposition may be performed to further electrically isolate the vias from each other.

Figure 3:
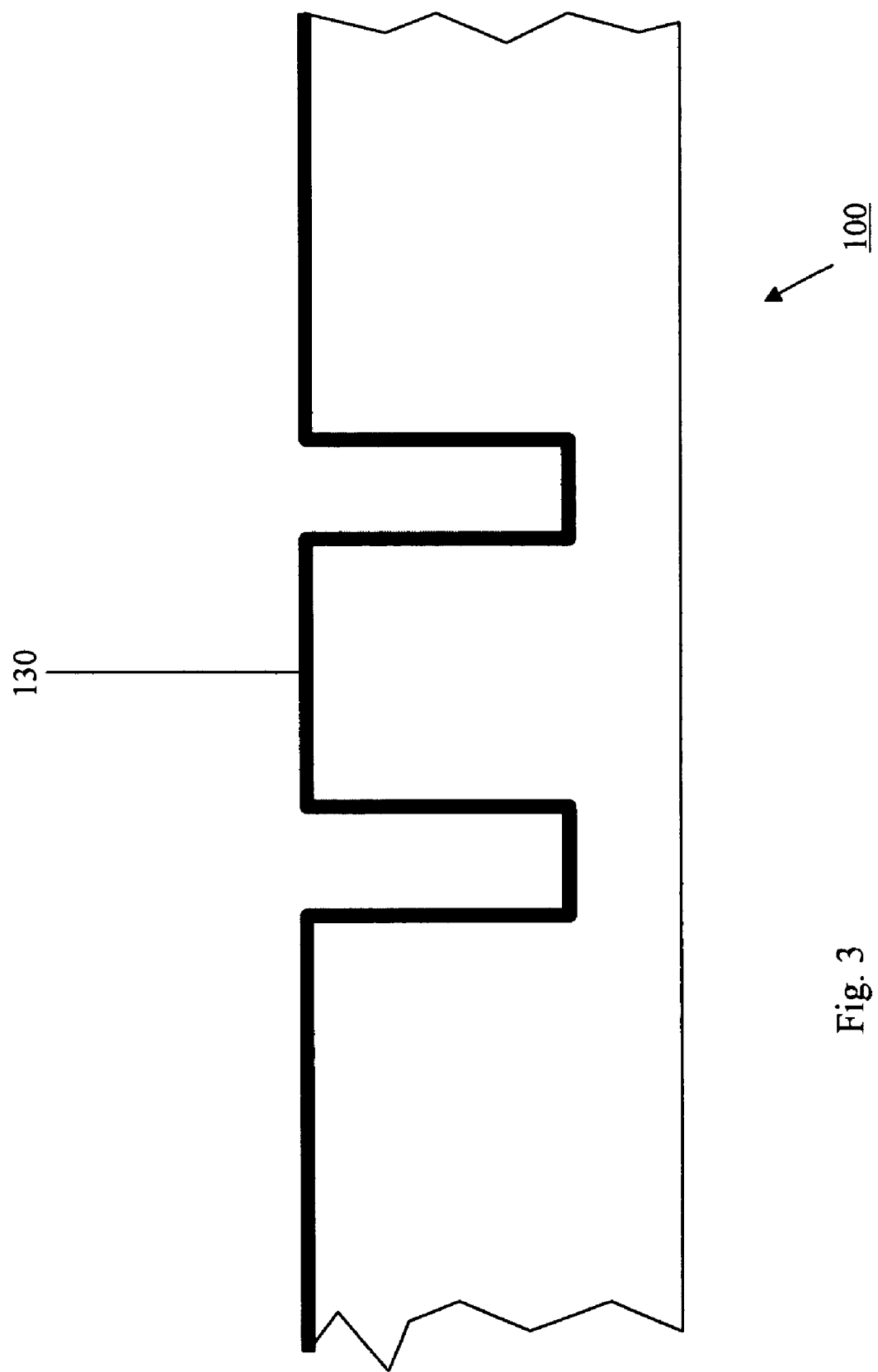
FIG. 3 is a cross sectional view of the exemplary substrate after a second step of fabrication.

FIG. 3 is a cross sectional view of the exemplary wafer 100 after a second step of fabrication of the through hole via. In FIG. 2, a seed layer 130 may be conformally deposited in the blind trenches 120. The seed layer 130 may be a two part system, for example, a layer of chrome (Cr) as an adhesion layer and a layer of gold (Au) as a plating and conducting layer, are deposited on the substrate 100. While a Cr/Au seed layer is described here, it should be understood that the seed layer may be composed of any of a number of other materials, which are effective for adhesion and plating of the conductive material into the blind hole, including titanium (Ti), copper (Cu), and nickel (Ni) The Cr/Au seed layer 130 may be deposited by, for example, chemical vapor deposition (CVD), evaporation or sputtering. An initial adhesion layer of Cr, Ti or other material may be deposited at thicknesses of 50 A up to 500 A, while the conductive plating base layer may be deposited at thicknesses of a few thousand Angstroms up to one micron or more, so long as reasonably low resistance conductive path is made to the bottom of the vias.

Figure 4:
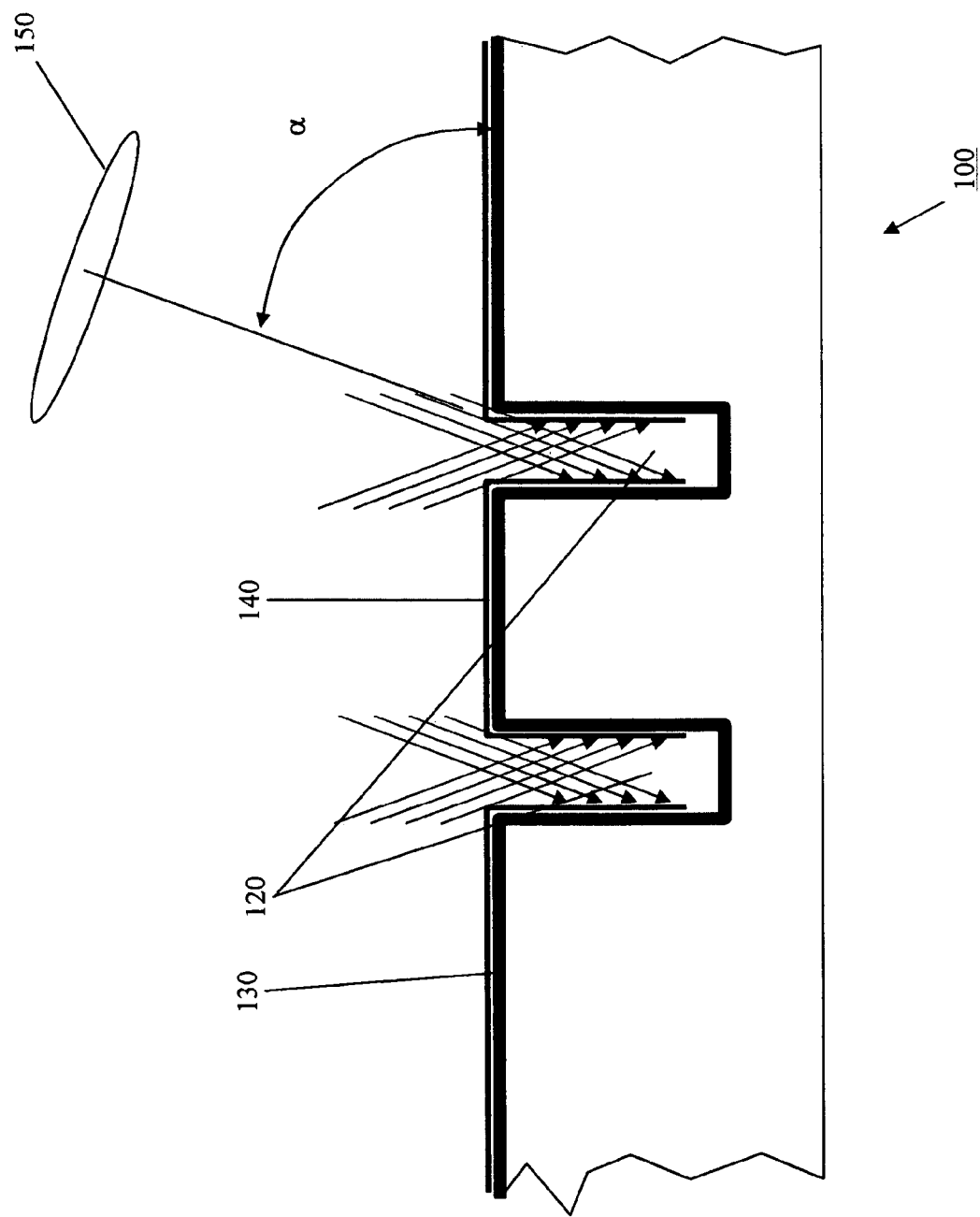
FIG. 4 is a cross sectional view of the exemplary substrate during a third step of fabrication.

FIG. 4 is a cross section of the exemplary wafer 100 after a third step of fabrication, which includes deposition of the inhibition layer 140. The deposition technique may be sputter deposition such as ion beam sputter deposition The inhibition layer 140 is deposited by tilting the substrate 100 with respect to the target 150 at an angle with respect to a line normal to the target 150 surface. Because the substrate 100 is disposed at the angle, the deposited species will be ejected from the target 150 at an angle α with respect to the substrate 100. Therefore, the walls of the trench may effectively shadow the lower portions of the trenches 120, so that the sputtered inhibition layer 140 may not be deposited in the lower portion as shown in FIG. 4. Instead, the sputtered inhibition layer 140 only coats an upper portion of the trench.

The inhibition layer 140 may be any number of materials, particularly insulating materials. For example, any oxide material such as silicon dioxide $SiO_2$, alumina $Al_2O_3$, tantalum oxide $Ta_2O_5$ or chromium oxide $Cr_2O_3$ may be used. In addition, any sputter-deposited polymer may also be used, as long as the sputtered film is insulating and reasonably predictable in terms of its location and thickness. However, any material which inhibits the plating of material from the plating bath may be used for the inhibition layer 140. Conductive materials can also be deposited and then oxidized in a subsequent step. A conductive layer of chrome Cr, for example, may be deposited and then rendered a dielectric by oxidizing it in, for example, an oxygen plasma, to produce chromium oxide.

The blind trench 120 may be coated uniformly by the inhibition layer 140 by rotating the tilted substrate 360 degrees. In various exemplary embodiments, the substrate 100 may be disposed at an angle α of between about 45 and about 90 degrees, and preferably between about 60 and about 80 degrees with respect to the axis normal to the target 150, and rotated at a rate of 1 revolution per 1 minute of sputter time. It should be understood that these details are exemplary only, and that any of a number of alternative sputtering configurations and conditions may exist which may be capable of forming the inhibition layer 140.

Although the systems and methods described here use a substrate 100 tilted with respect to the sputtering target 150, it should be appreciated that the same effect may be produced by tilting the substrate target 150 with respect to the substrate 100, and then rotating the tilted substrate target 150 about an axis normal to the surface of the substrate 100. In this embodiment, the sputtering target 150 may be disposed at an angle α with respect to a line normal to a surface of the substrate. The means for forming the partially exposed seed layer may therefore be a CVD system for depositing the seed layer or any metal deposition technique, such as metal evaporation, sputtering, etc., and a tilted sputtering system for depositing the inhibition layer.

Figure 5:
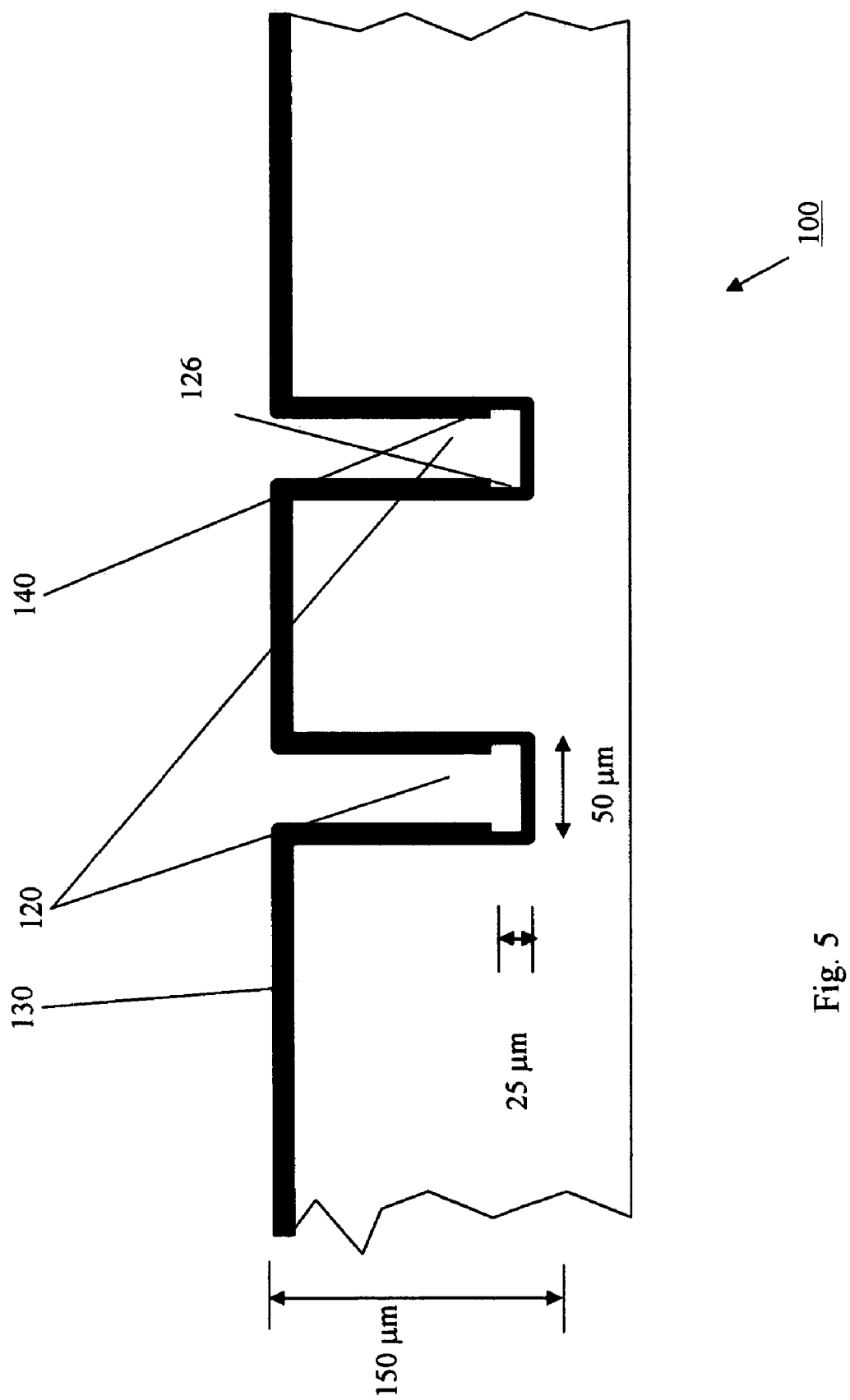
FIG. 5 is a cross sectional view of the exemplary substrate after the third step of fabrication.

FIG. 5 is a cross sectional view of the exemplary substrate 100 after the third step in the formation of the through hole vias. FIG. 5 shows the structure of the inhibition layer 140, before plating of the conductive material into the blind trenches 120. As shown in FIG. 5, the inhibition layer may cover only the upper 125 μm of a 150 μm trench, leaving the lower 25 μm of the seed layer 130 exposed This 25 μm portion may constitute the exposed region 126 of the seed layer 130. More generally, the inhibition layer 140 may come within about 100 μm or less of the end of the blind trench or blind hole 120. The width of the trench or diameter of the blind hole 120 may be, for example, about 50 μm wide.

Figure 6:
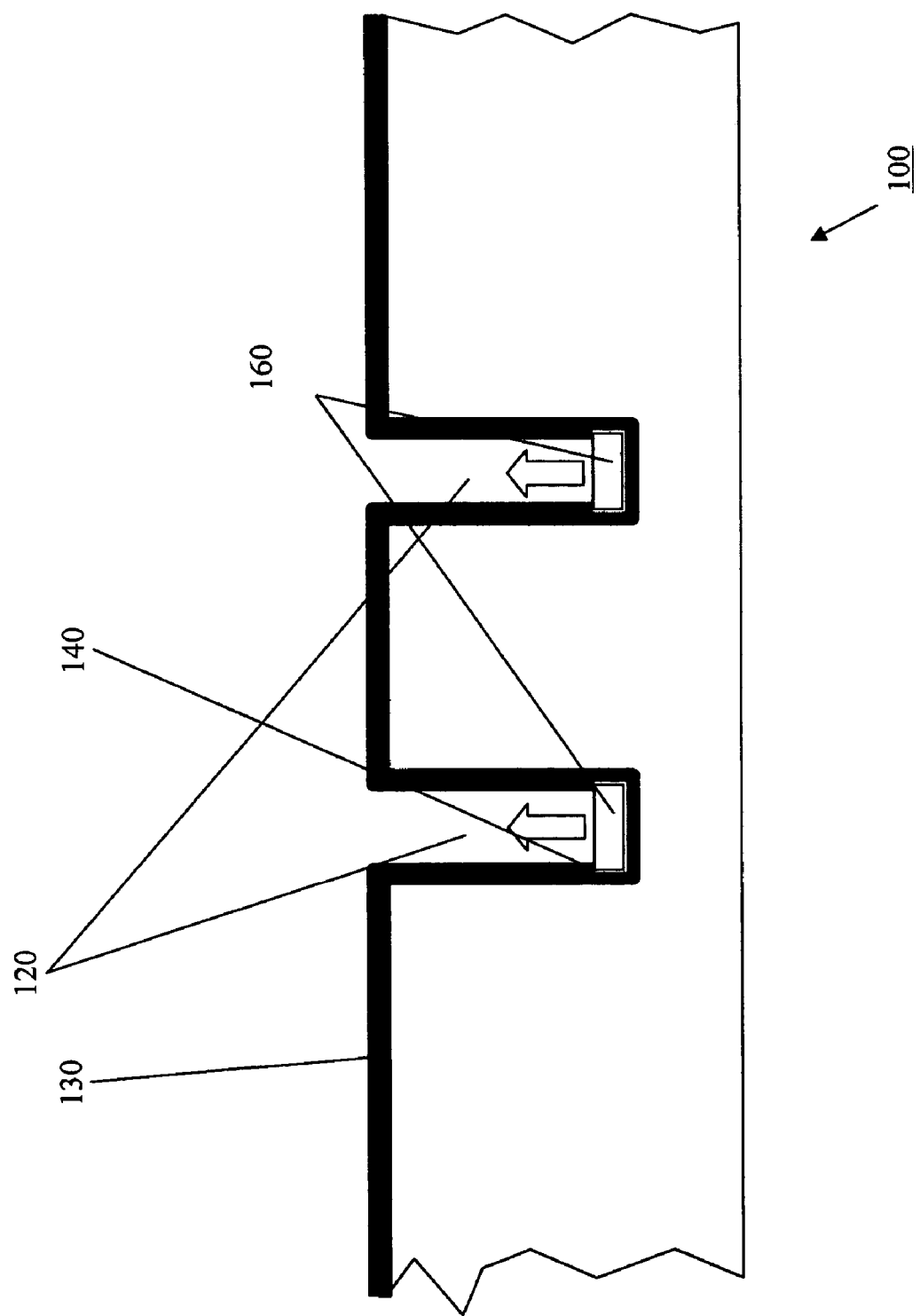
FIG. 6 is a cross sectional view of the exemplary substrate after a fourth step of fabrication.

FIG. 6 is a cross sectional view of the exemplary substrate 100 at the beginning of the deposition of the conductive species 160 into the blind trenches 120. The means for depositing the conductive material may be a plating system, including a plating bath and a power supply. The deposition may be performed by immersing the substrate into the plating bath, and coupling the seed layer to one terminal of the power supply. The plating species dissolved in the plating solution then may then be deposited as a layer 160 over the seed layer 130 which is only exposed at the bottom of the trenches 120. The plating of material 160 then proceeds in an upward fashion, beginning from the bottom of the blind trenches 120, as indicated by the arrows in FIG. 6. The plating therefore proceeds uniformly, without forming the voids characteristic of the prior art techniques. Using the techniques described here, blind trenches may be plated with nearly arbitrarily high aspect ratios.

The plated species may be copper, for example, plated by immersing the substrate in a plating solution containing copper sulfate and sulfuric acid. However, it should be understood that this embodiment is exemplary only, and that any other suitably conductive material which can be plated on the substrate, including gold (Au) or nickel (Ni), may be used in place of copper.

Figure 7:
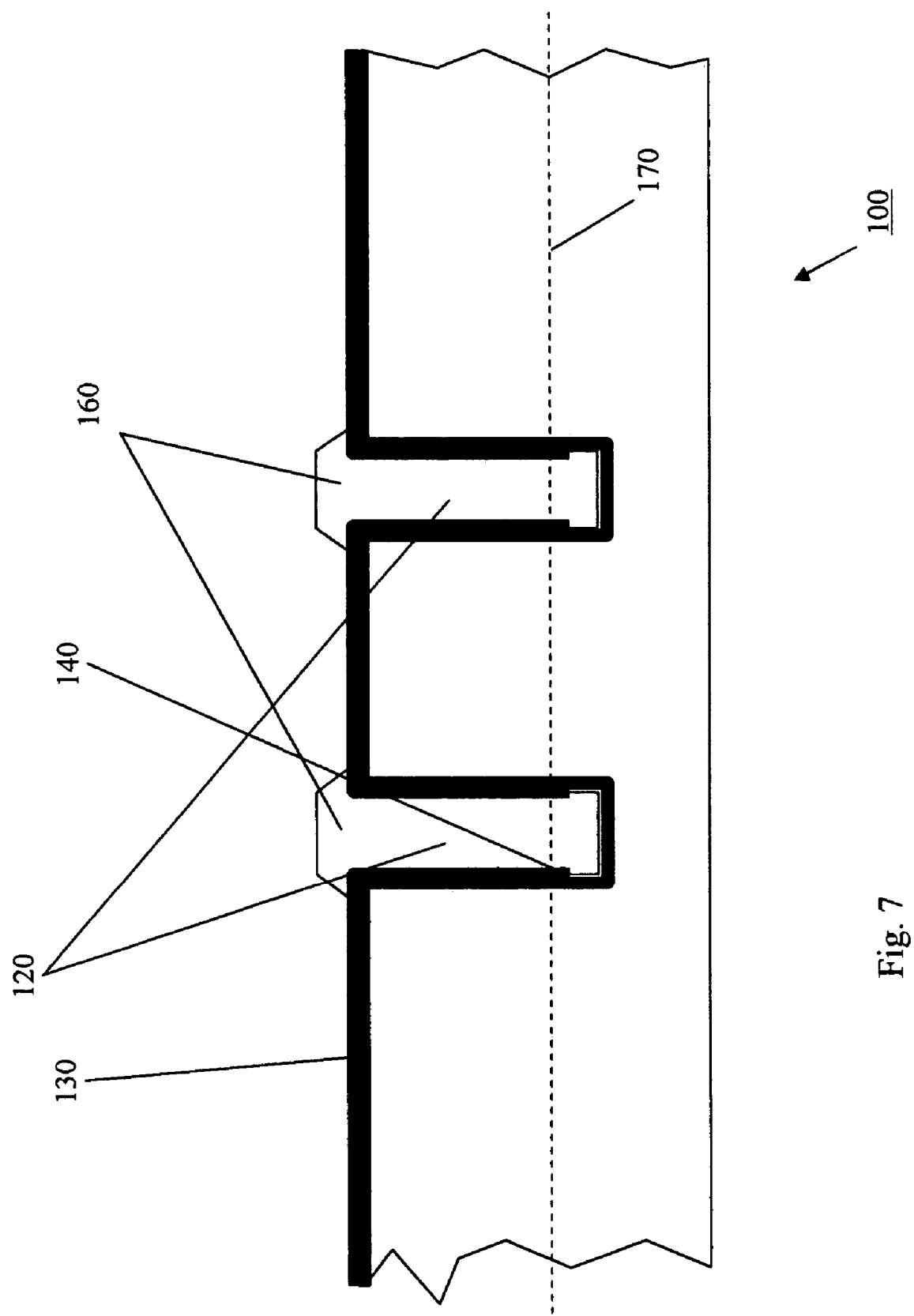
FIG. 7 is a cross sectional view of the exemplary substrate after a fifth step of fabrication.

FIG. 7 is a cross sectional view of the exemplary substrate 100 after completion of the plating step. As shown in FIG. 7, the plating proceeds to a point at which the plating material 160 is deposited in and over the blind trenches 120. Therefore, the plating process results in a non-planar top surface profile, which can be planarized using any known technique, such as chemical mechanical planarization (CMP). The CMP process may stop on the original substrate, such as Si, or on the inhibition layer described above. If the latter approach is used, the inhibition layer may be thick enough to remain after CMP of the Cu. This allows it to be used additionally as a top isolation layer if additional circuitry is later patterned on the wafer surface.

Finally, the through hole vias need to be formed from the blind trenches, by removing the dead-end walls of the blind trenches. The through vias may be formed by, for example, grinding or polishing the backside 170 of the substrate 100, to remove material from the backside to a point 170 at which the blind walls have been removed. For example, grinding may be employed to quickly remove about 100 to about 400 μm of silicon from a 500 μm thick substrate, leaving 100 μm of material as substrate 100. The grinding can be done either before, but typically after the via substrate 100 is bonded to a device substrate. Accordingly, using the methods described here, through hole vias of diameter less than about 50 μm and depths of at least about 100 μm may be made. More particularly, the aspect ratio of the via, that is, the ratio of the depth of the via to its width, may be at least one-to-one.

Alternatively, instead of grinding, the through hole vias may be made using a silicon-on-insulator composite substrate. The blind holes may be etched as described above through the thick handle wafer, and coated with the seed layer and plated as before. However, using the silicon-on-insulator wafer, the device layer and oxide layers may then be removed, to expose the end of a via plated in the handle wafer, to create the through-hole. In yet another embodiment, the through holes may be created in the thinner device layer, and the oxide layer and handle wafer may then be removed.

Figure 8:
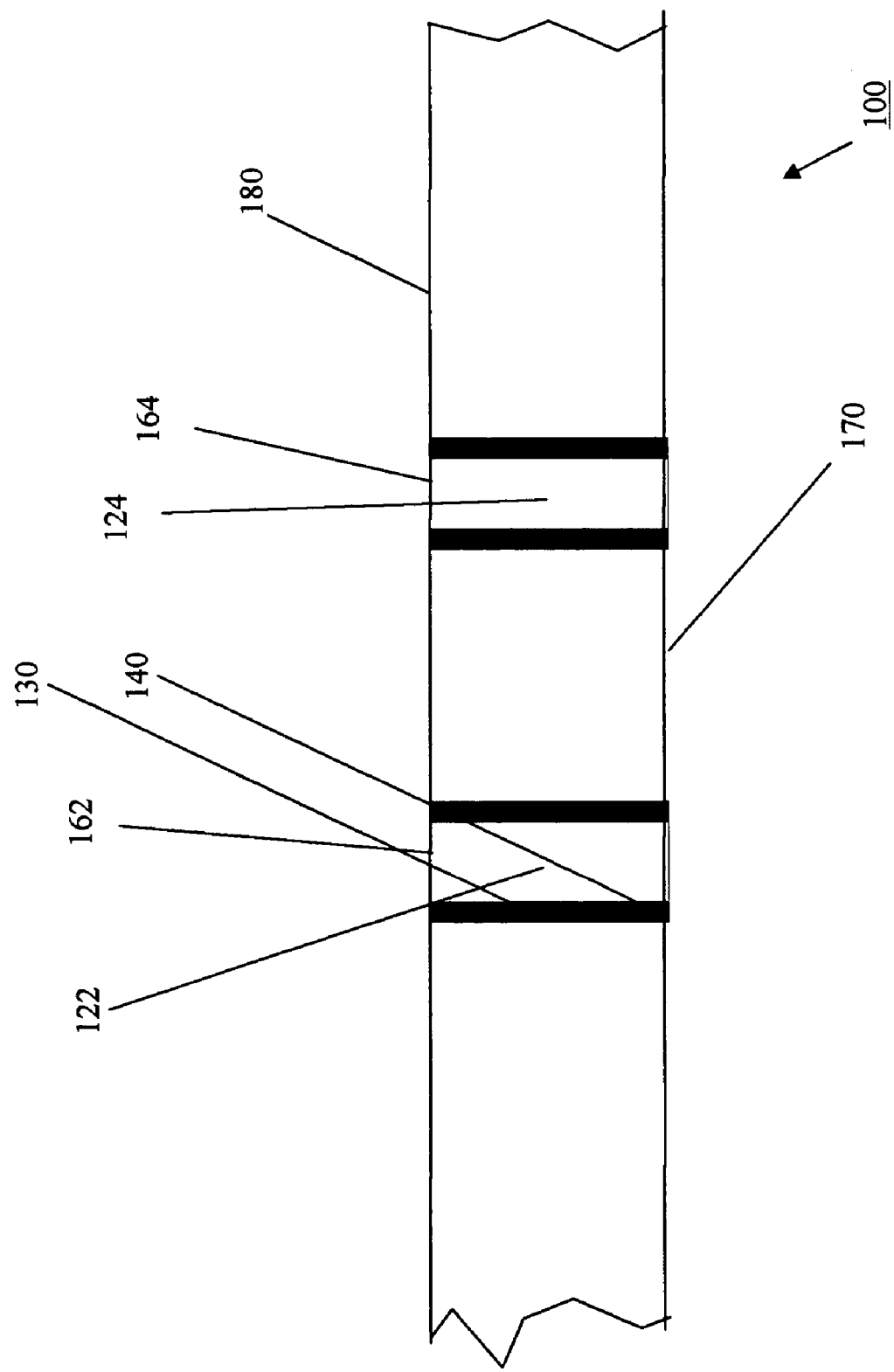
FIG. 8 is a cross sectional view of the exemplary substrate after a sixth step of fabrication.

FIG. 8 shows the exemplary substrate 100 upon completion of the fabrication steps for the through hole vias 120. The through hole vias 120 may be completed by polishing the top surface 180 to a point at which the seed layer 130 and inhibition layer 140 have been removed from the top surface 180, and the bottom surface 170 has been background to remove material until the blind walls have been removed. At this point, there is no conductive path between the through hole vias, as the plated material 162 within each via 122 is electrically isolated from the plated material 164 within every other via 124 by the inhibition layer 140. Therefore, the techniques described here may be used to make electrically isolated vias 122, 124 within a conducting substrate 100, as well as conducting vias 122, 124 within an insulating substrate 100.

Figure 9:
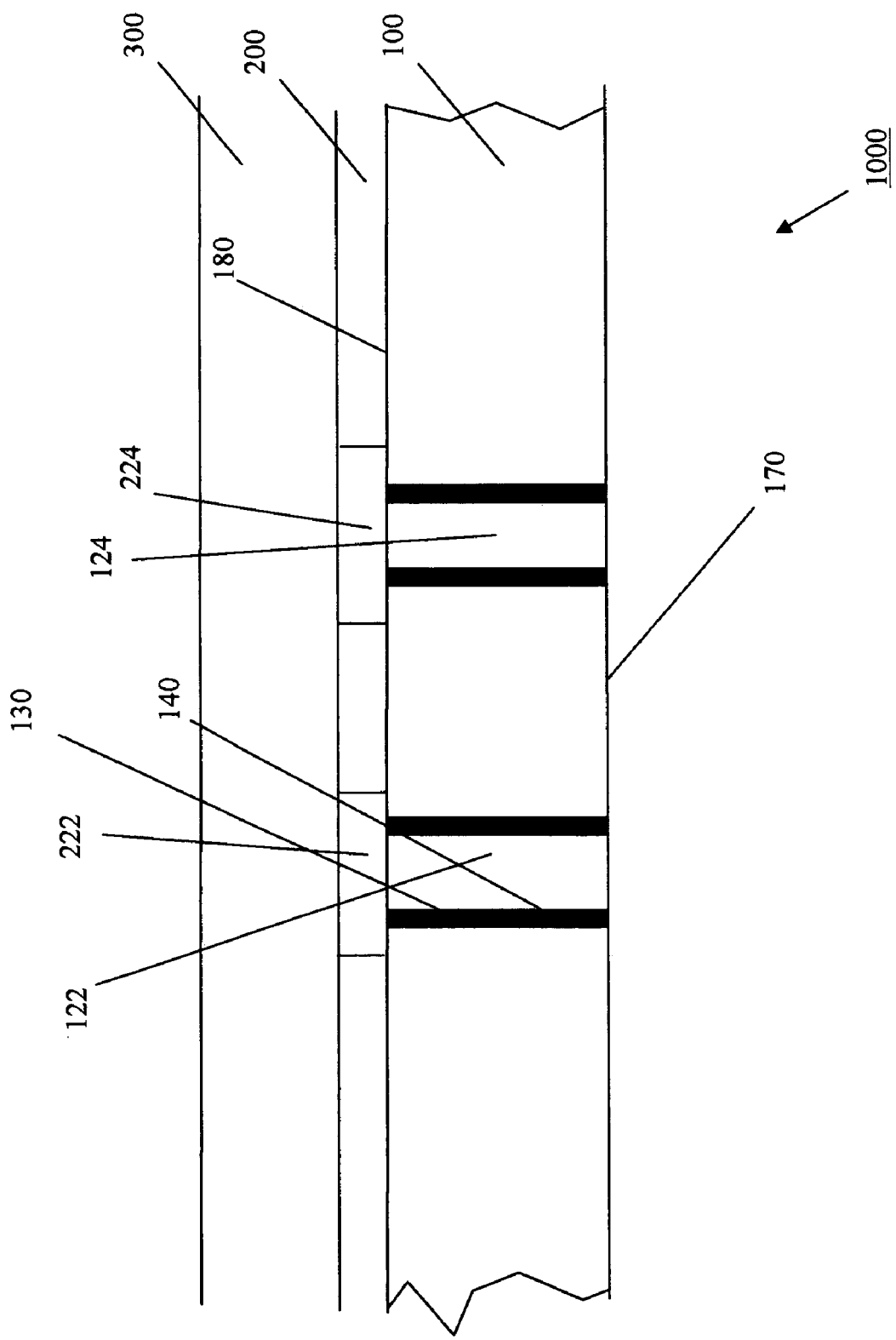
FIG. 9 is a cross sectional view of the composite SOI wafer after assembly with the substrate of FIG. 8.

Substrate 100 of FIG. 8 may be assembled into a silicon-on-insulator wafer 1000 as shown in FIG. 9. In FIG. 9, the substrate 100 has been overcoated with an insulating layer 200 and bonded to a device wafer 300, in which the features of a MEMS device will be formed. The insulating layer 200 may be formed as part of the via isolation layer described above. In various exemplary embodiments, the insulating layer 200 is silicon dioxide, and the device layer 300 is silicon. Prior to bonding, the silicon dioxide layer may be patterned with an additional set of thin conductive vias 222 and 224, which correspond to the through hole vias 122 and 124, that will connect the through hole vias 122 and 124 to the MEMS device, as will be described further below. The silicon device wafer 300 is then bonded to the insulating layer 200. The MEMS device is then formed in the device layer. The through hole vias as described above, may thereby provide electrical access to a MEMS device, such as that described next and illustrated in FIG. 10.

Figure 10:
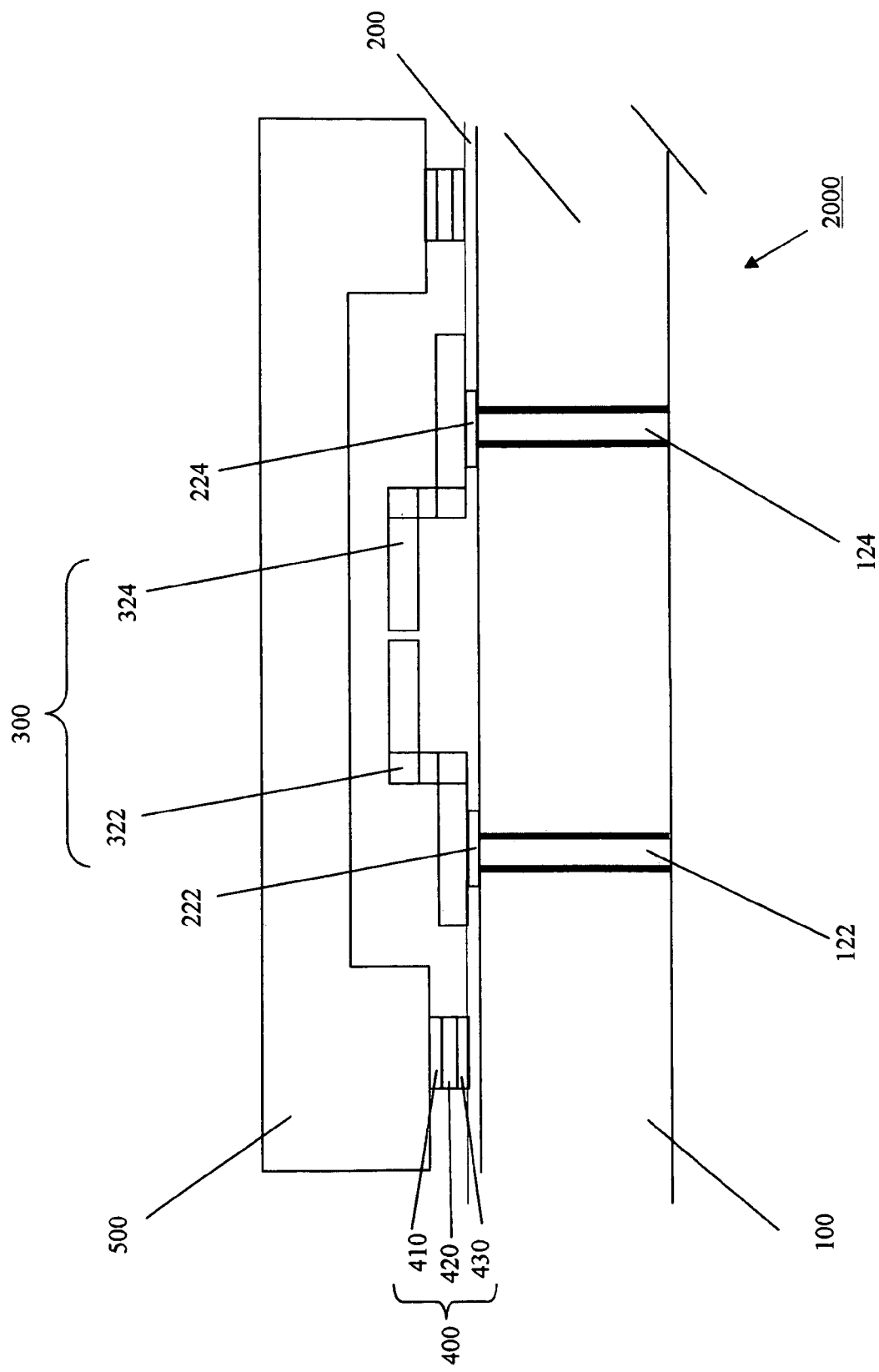
FIG. 10 illustrates an exemplary MEMS switch using the through hole vias.

FIG. 10 shows an exemplary finished MEMS device 2000, sealed in a hermetic package. The MEMS device may be a switch or relay 300 having two portions, 322 and 324 which, when the switch is activated, may touch to close a circuit. Since the details of the MEMS switch 300 are not necessary to the understanding of the systems and methods disclosed here, the MEMS switch 300 is shown only schematically in FIG. 10. It should be understood that the MEMS switch shown in FIG. 10 is exemplary only, and that any other MEMS device may make use of the systems and methods disclosed here, including MEMS sensors, actuators, accelerometers, and other devices. Similarly, the systems and methods disclosed here may be applied to non-MEMS devices.

Electrical contact with the through hole vias 122 and 124 may be made by depositing a layer of a conductive material 222 and 224, into a pair of holes made in insulating layer 200. After securing the device layer 300 to the insulating layer 200, the features 322 and 324 of the MEMS switch 300 may be formed in the device layer by, for example, deep reactive ion etching through the device layer to the insulating layer 200. The features 322 and 324 may be formed in locations corresponding to the locations of the through hole vias 122 and 124 and conductive material regions 222 and 224. The insulating layer 200 may remain under the outboard portions of MEMS features 322 and 324, in order to anchor the MEMS features 322 and 324 to the substrate surface 100. Elsewhere under MEMS features 322 and 324, the insulating layer 200 has been etched away to release MEMS features 322 and 324, so that MEMS features 322 and 324 are free to move. A wet etchant such as hydrofluoric acid (HF) may be used to remove the insulating layer 200 under the MEMS features 322 and 324.

MEMS switch 300 is then encapsulated in a cap or lid wafer 500, which has been relieved in areas to provide clearance for the movement of MEMS switch 300. The hermetic seal may be made by, for example, forming an alloy seal 400 as taught in greater detail in U.S. patent application Ser. No. 11/211,625 and U.S. patent application Ser. No. 11/211,622 incorporated by reference herein in their entirety. The alloy seal 400 may be an alloy of gold (Au) layers 410 and 430 and indium (In) layer 420, in the stoichiometry of $AuIn_2$.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes an embodiment including a MEMS switch, it should be understood that this embodiment is exemplary only, and that the systems and methods disclosed here may be applied to any number of alternative MEMS or non-MEMS devices. Accordingly, the exemplary implementations set forth above, are intended to be illustrative, not limiting.

What is claimed is:

1. A method for forming a via for a MEMS device, comprising:
   forming at least one trench with a dead-end wall in a front side of a substrate;
   forming a partially exposed seed layer in the trench;
   depositing a conductive material in the trench;
   coupling the conductive material electrically to the MEMS device; and
   removing material from a backside of the substrate to a point at which the dead-end wall of the trench has been removed.

2. The method of claim 1, wherein forming the partially exposed seed layer comprises depositing an inhibition layer over a portion of a seed layer down to a level within at least about 100 µm of the dead-end wall of the trench.

3. The method of claim 2, wherein the inhibition layer is at least one of silicon dioxide, alumina, tantalum oxide and chromium oxide.

4. The method of claim 1, wherein the conductive material is deposited by electroplating.

5. The method of claim 4, wherein the conductive material is at least one of copper, gold, and nickel.

6. The method of claim 2, wherein forming the inhibition layer covering a portion of the seed layer down to a level just above the dead-end wall of the blind trench comprises at least one of tilting the substrate with respect to a sputtering target and disposing the sputtering target at an angle with respect to a line normal to a surface of the substrate.

7. The method of claim 6, wherein tilting the substrate with respect to the target comprises tilting the substrate to produce a deposition angle of between about 45 degrees and 90 degrees with respect to the wafer.

8. The method of claim 6, wherein forming the inhibition layer covering a portion of the seed layer down to a level just above the dead-end wall of the blind trench further comprises at least one of rotating the tilted substrate and rotating the target about the line normal to the surface of the substrate.

9. The method of claim 8, wherein the rotating of the tilted substrate results in the deposition of the inhibition layer that ends within about 100 µm or less of the dead-end wall of the blind trench.

10. The method of claim 1, wherein the partially exposed seed layer includes at least one of chromium, copper, gold, and nickel.

11. A substrate for the formation of a MEMS device, comprising:
    at least one opening formed in a substrate;
    a partially exposed seed layer in the opening; and
    a conductive material plated into the opening, providing an electrical connection to the MEMS device.

12. The substrate of claim 11, wherein the partially exposed seed layer comprises an inhibition layer covering a portion of the seed layer down to a level within at least about 100 µm or less of an end of the opening.

13. The substrate of claim 12, wherein the inhibition layer comprises at least one of silicon dioxide, alumina, tantalum oxide and chromium oxide.

14. The substrate of claim 11, further comprising:
a sacrificial layer deposited on the substrate; and
a device layer secured to the sacrificial layer, from which features of the MEMS device are formed.

15. The substrate of claim 14, further comprising:
a cap wafer with a relieved area providing clearance for the device, hermetically sealed to at least one of the substrate, sacrificial layer and device layer.

16. The substrate of claim 11, wherein the conductive material comprises at least one of gold, copper or nickel.

17. The substrate of claim 11, wherein the partially exposed seed layer comprises at least one of titanium, chromium, copper, gold and nickel.

18. The substrate of claim 11, wherein the at least one opening has a ratio of depth to width of at least about one-to-one.

19. A configuration for forming a via for a MEMS device, comprising:
means for forming at least one trench with a dead-end wall in a front side of a substrate;
means for forming a seed layer in the trench;
means for depositing a conductive material within the trench;
the MEMS device formed over the substrate;
means for coupling the conductive material electrically to the MEMS device; and
means for removing material from a backside of the substrate to a point at which the dead-end wall of the trench has been removed.

* * * * *